United States Patent
Suganuma

(10) Patent No.: US 7,706,542 B2
(45) Date of Patent: Apr. 27, 2010

(54) NOISE REMOVAL DEVICE

(75) Inventor: Hisashi Suganuma, Saitama (JP)

(73) Assignee: Pioneer Corporation, Tokyo (JP)

( * ) Notice: Subject to any disclaimer, the term of this patent is extended or adjusted under 35 U.S.C. 154(b) by 1066 days.

(21) Appl. No.: 11/389,497

(22) Filed: Mar. 27, 2006

(65) Prior Publication Data
US 2006/0215840 A1    Sep. 28, 2006

(30) Foreign Application Priority Data
Mar. 28, 2005    (JP) .............................. 2005-091876

(51) Int. Cl.
H04H 20/48    (2008.01)
H04B 15/00    (2006.01)

(52) U.S. Cl. ........................................ 381/13; 381/94.1

(58) Field of Classification Search ................... 381/13, 381/94.1, 94.8, 94.5, 71.14, 7, 4, 3, 2, 1; 327/94, 551; 455/222, 223, 278.1, 283, 295, 455/296
See application file for complete search history.

(56) References Cited

U.S. PATENT DOCUMENTS

| 5,036,543 | A | | 7/1991 | Ueno |
| 5,311,087 | A | * | 5/1994 | Suganuma .................. 327/94 |
| 5,907,624 | A | * | 5/1999 | Takada ....................... 381/94.2 |
| 7,103,122 | B2 | * | 9/2006 | Suganuma .................. 375/350 |
| 7,551,743 | B1 | * | 6/2009 | Tsujishita et al. .......... 381/94.1 |
| 2001/0016475 | A1 | | 8/2001 | Tsujishita et al. |
| 2004/0108906 | A1 | * | 6/2004 | Suganuma .................. 331/17 |
| 2005/0153674 | A1 | * | 7/2005 | Suganuma .................. 455/296 |

FOREIGN PATENT DOCUMENTS

| EP | 0 405 541 | A2 | 1/1991 |
| EP | 1 128 550 | A2 | 8/2001 |
| JP | 10-75190 | | 3/1998 |
| JP | 10-75190 | A | 3/1998 |
| JP | 2001-237725 | A | 8/2001 |
| JP | 3573050 | B2 | 7/2004 |

* cited by examiner

Primary Examiner—Curtis Kuntz
Assistant Examiner—Hai Phan
(74) Attorney, Agent, or Firm—Arent Fox LLP

(57) ABSTRACT

It is an object of the present invention to provide an improved noise removal device having an improved noise removal precision. A second noise extracting unit extracts a noise of an IF signal, and outputs a second noise signal which is then smoothed by a second noise smoothing unit to produce a second noise-smoothed signal. A noise hold control signal generating unit compares the second noise-smoothed signal with the second noise signal to produce a noise hold control signal indicating an occurring position and an occurring period of the noise of the IF signal. A first noise extracting unit extracts a noise of an FM detection signal, and outputs a first noise signal. A noise hold unit holds the first noise signal in accordance with the noise hold control signal to produce a held noise signal which is then smoothed by a first noise smoothing unit to produce a first noise-smoothed signal. A hold control signal generating unit compares the first noise-smoothed signal with the first noise signal to produce a hold control signal indicating an occurring position and an occurring period of the noise of the FM detection signal. Subsequently, a hold unit operates to hold the FM detection signal in accordance with the hold control signal, thereby generating and thus outputting an FM detection signal not containing any noise.

4 Claims, 10 Drawing Sheets

PRIOR ART

NOISE REMOVAL DEVICE

BACKGROUND OF THE INVENTION

The present invention relates to a noise removal device for removing a noise mixed in a signal.

The present application claims priority from Japanese Application No. 2005-091876, the disclosure of which is incorporated herein by reference.

Generally, when an electronic device processes a signal, it is important to remove a noise from the signal.

For example, in a conventional FM radio receiver disclosed in Japanese Unexamined Patent Application Publication No. 10-75190, as shown in FIG. 1 of the patent application, a noise removal device is used to remove a noise which occurs once an over-modulated FM wave is FM-detected, and a signal processing such as a stereo demodulation is performed based on an FM detection signal (a composite signal) aimed at noise reduction.

Further, in a conventional vehicle radio receiver mounted on an automobile, a noise removal device is used to remove a noise such as an ignition noise mixed in an FM detection signal generated from an electronic device, and a signal processing such as a stereo demodulation is performed based on an FM detection signal aimed at noise reduction.

Now, with reference to FIG. 1 which is a block diagram and FIG. 2 which is a waveform chart, description will be given to explain the composition of a conventional and commonly used noise removal device provided in a vehicle radio receiver, also to explain a noise removal method. As shown, the conventional noise removal device comprises: a main path including a delay circuit 1 and a hold circuit 2; and a control path including a high pass filter 3, a smoothing circuit 4, a comparator 5, and a hold period adjusting circuit 6.

Once there is an input of an FM detection signal Sin containing a pulse-like noise Nz shown in FIG. 2(a), the high pass filter 3 in the control path will operate to inhibit certain signal component of the FM detection signal Sin, but allow the passing of the Noise Nz therethrough. Then, as shown in FIG. 2(b), a noise component Snz passed therethrough is smoothed by the smoothing circuit 4 to produce a smoothed DC signal Sdc which is used as a threshold value by the comparator 5 when the comparator 5 compares the DC signal Sdc with a noise component Snz, thereby generating a period detection signal Spd indicating an occurring period of the noise Nz shown in FIG. 2(c). Afterwards, the hold period adjusting circuit 6 will operate to finely adjust a time width of the period detection signal Spd in accordance with a predetermined fixed time, thereby generating a hold control signal Sh which is supplied to the hold circuit 2. On the other hand, with regard to the main path of the noise removal device, the delay circuit 1 will operate to make the FM detection signal Sin synchronized with the delay time of the control path before the FM detection signal Sin is inputted into the hold circuit 2. Then, as shown in FIG. 2(d), the hold circuit 2 will operate in synchronism with the hold control signal Sh to hold the noise Nz mixed in the FM detection signal Sin, thereby generating and thus outputting a noise-reduced FM detection signal Sout.

Thus, the conventional noise removal device is used to detect an accruing period of the noise Nz mixed in the FM detection signal Sin shown in FIG. 2(a), so as to generate the hold control signal Sh, and then, as shown in FIG. 2(d), to hold the Noise Nz in synchronism with the hold control signal Sh, thereby generating an FM detection signal Sout whose noise Nz has been reduced.

Moreover, the conventional FM radio receiver disclosed in Japanese Unexamined Patent Application Publication No. 10-75190 is used to extract a noise from an FM detection signal and then smoothen the extracted noise so as to produce a smoothed signal. Meanwhile, the smoothed signal is compared with the foregoing noise so as to generate a hold control signal indicating a noise occurring period. Then, the noise is held in synchronism with the hold control signal to generate a noise-reduced FM detection signal.

However, with regard to the noise removal devices provided in the aforementioned vehicle radio receiver and the FM radio receiver disclosed in Japanese Unexamined Patent Application Publication No. 10-75190, as shown in FIG. 2(b), a smoothed signal Sdc containing a smoothed noise occurred during a relatively long period is compared with each noise component to generate a hold control signal Sh in a manner such that a period during which a noise component Snz having a larger amplitude than the smoothed signal Sdc occurs will serve as a hold period. However, since the level (amplitude) of the smoothed signal Sdc will change in response to a change in the occurring density and the amplitude of the noise Nz, it was difficult to precisely detect the occurring period of each noise Nz.

Namely, as far as its nature is concerned, a noise is not something that occurs at certain density in time (in other words, frequency). In fact, each noise also changes independently from time to time in its intensity (amplitude) and waveform. For this reason, when the comparator 5 operates to detect an occurring period of a pulse-like noise occurring at certain instant in time, since it detects such an occurring period using a smoothed signal having a constant amplitude as a threshold value while being affected by the intensity and density of other noises occurring in a relatively long period, a change in the threshold level due to an influence from other noises makes it difficult to precisely detect the occurring period of the pulse-like noise, resulting in a problem that once a noise signal is held by the hold circuit 2, the noise will still be mixed in the FM detection signal Sout and this can cause part of the detection signal missing.

SUMMARY OF THE INVENTION

The present invention has been accomplished in view of the above-discussed conventional problem and it is an object of the invention to provide an improved noise removal device capable of precisely detecting an occurring period of each noise, thus ensuring an increased noise removal precision with respect to a signal to be processed.

According to the present invention, there is provided a noise removal device for removing a noise mixed in a signal, which device comprises: first noise extracting means for extracting a noise currently mixed in a first input signal and outputting the noise as a first noise signal; second noise extracting means for extracting a noise currently mixed in a second input signal and outputting the noise as a second noise signal; second noise smoothing means for smoothing the second noise signal to generate a second noise-smoothed signal; noise hold control signal generating means which takes the second noise-smoothed signal as a threshold value and compares the second noise signal with the threshold value to detect an occurring position and an occurring period of the second noise signal and to generate a noise hold control signal having a hold period corresponding to a result of the detection; noise hold means for holding the first noise signal in accordance with the noise hold control signal to generate and thus output a held noise signal; first noise smoothing means for smoothing the held noise signal to generate a first noise-smoothed signal; hold control signal generating means which takes the first noise-smoothed signal as a threshold value and compares the first noise signal with the threshold value to detect an occurring position and an occurring period of the first noise signal and to generate a noise hold control signal having a hold period corresponding to a result of the detection; and hold means for holding the first noise signal in accordance with the noise hold control signal to generate and thus output the first input signal not containing any noise.

BRIEF DESCRIPTION OF THE DRAWINGS

These and other objects and advantages of the present invention will become clear from the following description with reference to the accompanying drawings, wherein.

DETAILED DESCRIPTION OF THE PREFERRED EMBODIMENTS

Figure 1:
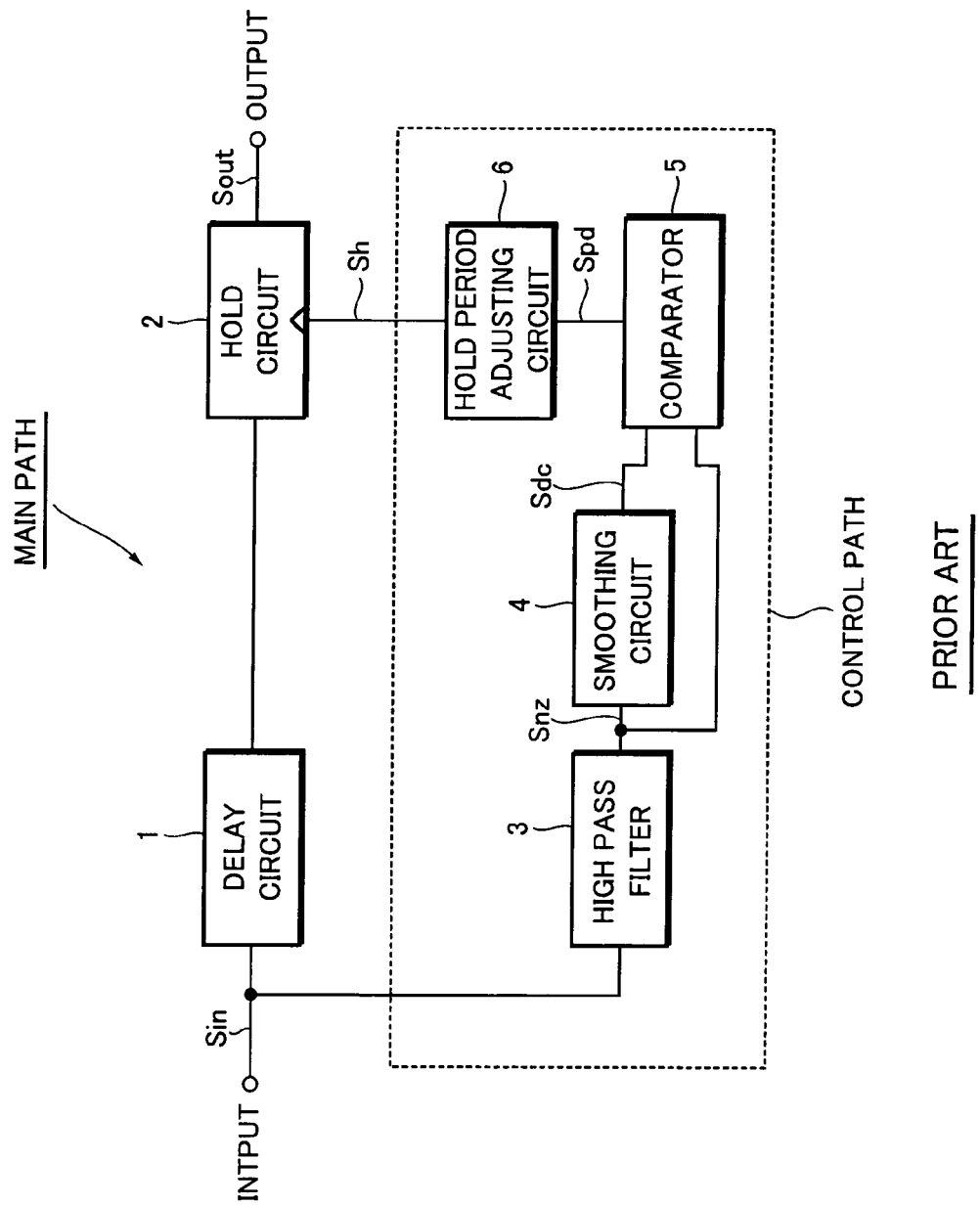
FIG. 1 is a block diagram showing the composition of a conventional noise removal device.
Figure 2:
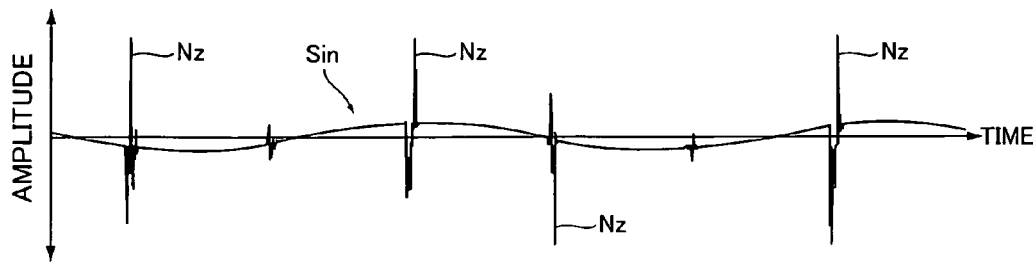
FIGS. 2(a) to 2(d) are waveform charts for explaining a noise removal method based on the conventional noise removal device shown in FIG. 1.
Figure 2:
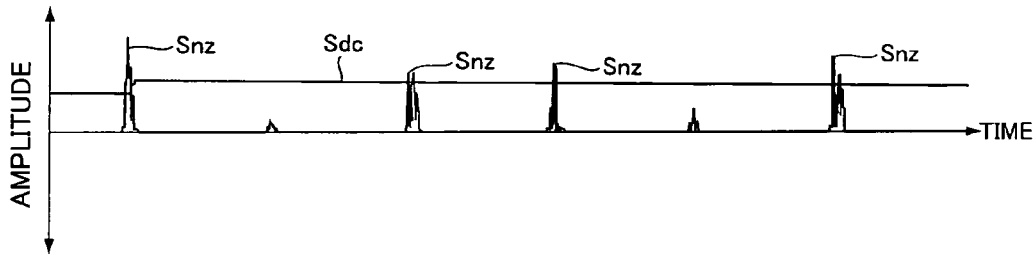
Figure 2:
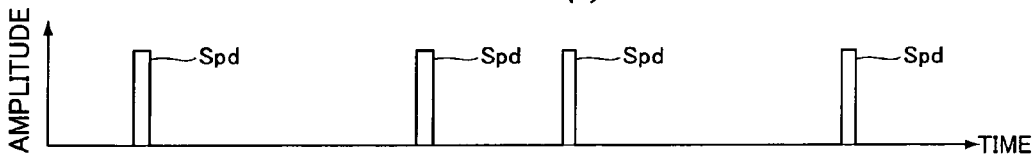
Figure 2:
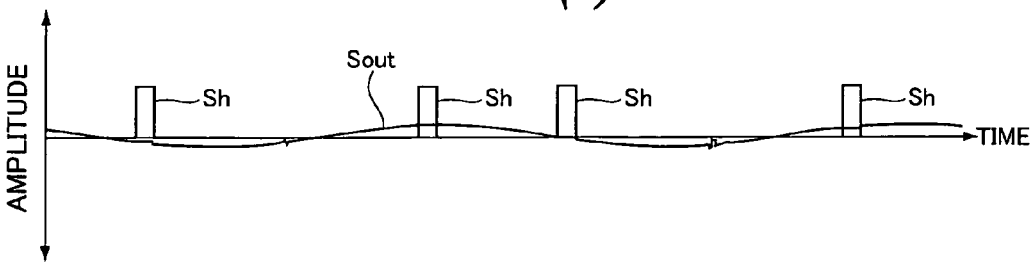
Figure 3:
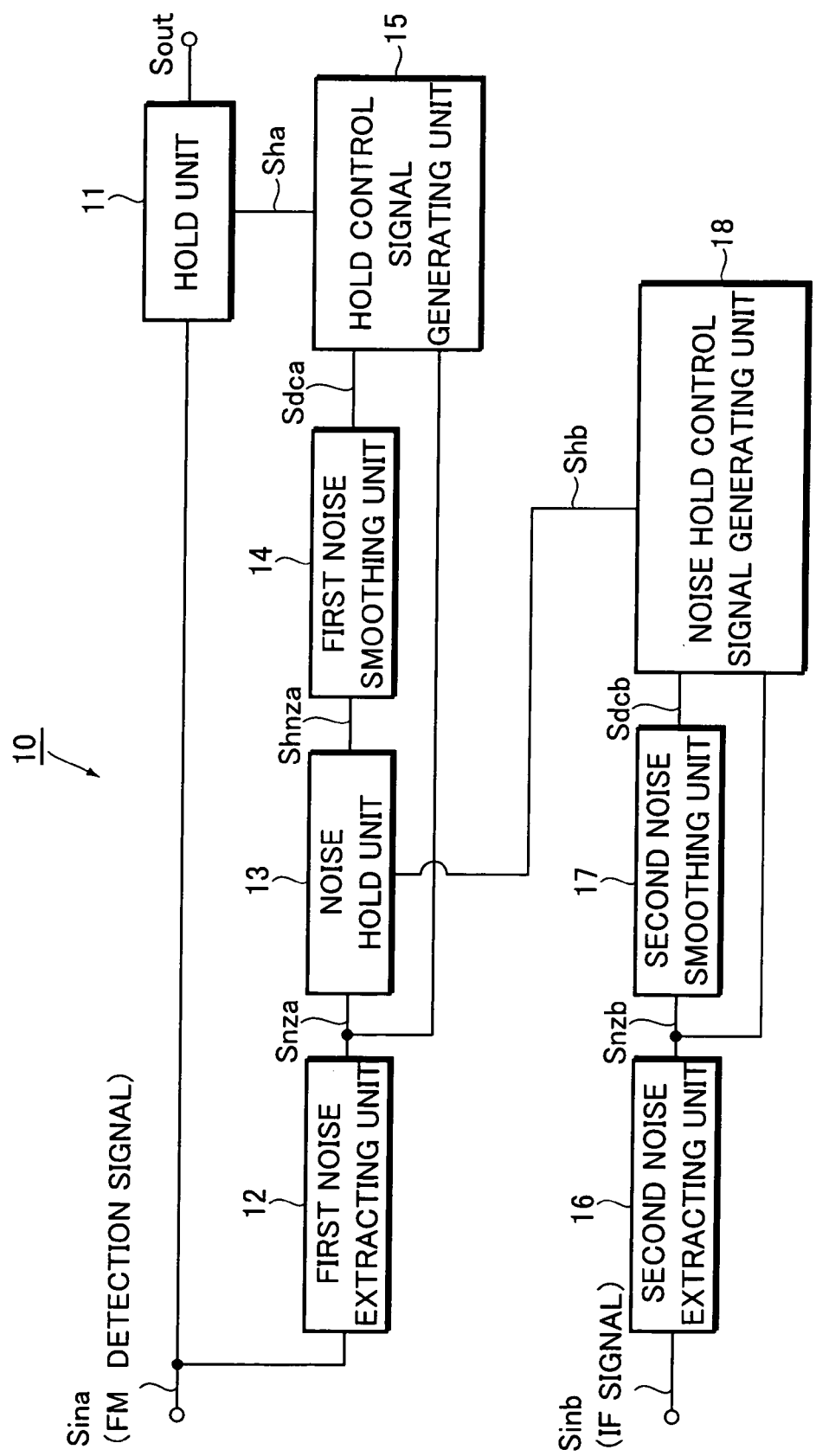
FIG. 3 is a block diagram showing the composition of a noise removal device formed according to a preferred embodiment of the present invention.

In the following, description will be given to explain an improved noise removal device for use in a vehicle radio receiver, as a preferred embodiment of the present invention. FIG. 3 is a block diagram showing the composition of the noise removal device formed according to this embodiment.

As shown in FIG. 3, the noise removal device is represented by a reference numeral 10 and comprises: i) a hold unit 11 provided in the main path of the noise removal device; ii) a first noise extracting unit 12, a noise hold unit 13, a first noise smoothing unit 14, and a hold control signal generating unit 15, all provided in a first control path; iii) a second noise extracting unit 16, a second noise smoothing unit 17, and a noise hold control signal generating unit 18, all provided in a second control path.

At first, the hold unit 11 receives, as a first input signal, an FM detection signal Sina outputted from an FM detector (not shown), and then holds a noise mixed in the FM detection signal Sina in synchronism with a hold period Ta specified by a hold control signal Sha which will be discussed later, thereby generating and thus outputting a noise-reduced FM detection signal Sout.

The first noise extracting unit 12 receives, as a first input signal, the FM detection signal Sina, passes and thus outputs a noise mixed in a frequency band having a higher frequency than the signal component of the FM detection signal Sina.

The noise hold unit 13 holds a first noise signal Snza passing through and thus outputted from the first noise extracting unit 12, in accordance with a noise hold period Tb specified by a noise hold control signal Sha which will be discussed later, thereby outputting the first noise signal Snza to the first noise smoothing unit 14.

The first noise smoothing unit 14, by smoothing a noise signal Shnza held by and outputted from the noise hold unit 13, generates a first noise-smoothed signal Sdca which is a DC signal and supplies the signal to the hold control signal generating unit 15.

The hold control signal generating unit 15 operates to perform a comparison between the amplitudes of the first noise-smoothed signal Sdca and the first noise signal Snza, and detects a period during which the first noise signal Snza exhibits a large amplitude, as an occurring position and an occurring period of the noise mixed in the FM detection signal Sina. Further, a hold control signal Sha specifying the detected noise occurring position and the detected noise occurring period as a hold period is generated and supplied to the hold unit 11 so as to perform a hold operation, thus holding the noise mixed in the FM detection signal Sin, thereby producing and outputting a noise-reduced FM detection signal Sout.

The second noise extracting unit 16 receives, as a second input signal, an intermediate frequency signal of a base band outputted from a frequency converter (not shown), i.e., an IF signal Sinb generated by a mixed detection performed between a reception wave and a local signal, extracts and thus outputs the noise mixed in the IF signal Sinb by inhibiting the passing of a signal component within a maximum frequency deviation of the IF signal Sinb and its high frequency component. The second noise smoothing unit 17 operates to smooth a second noise signal Snzb extracted by and outputted from the second noise extracting unit 16, so as to generate a second noise-smoothed signal Sdcb which is a DC signal and supply the signal to the noise hold control signal generating unit 18.

The noise hold control signal generating unit 18 performs a comparison between the amplitudes of the second noise signal Snzb and the second noise-smoothed signal Sdcb, and detects a period during which the second noise signal Snzb exhibits a large amplitude, as an occurring position and an occurring period of the noise mixed in the FM detection signal Sinb. Further, a noise hold control signal Shb specifying the detected noise occurring position and the detected noise occurring period as a hold period is generated and supplied to the noise hold unit 13 so as to hold the first noise signal Snza and generate the aforementioned held noise signal Shnza.

Next, description will be given to explain an operation of the noise removal device 10 of the present embodiment having the above-described composition.

As mentioned above, once the FM detector FM-detects an IF signal Sinb outputted from the frequency converter and thus an FM detection signal Sina is outputted, such an FM detection signal Sina is inputted into the hold unit 11 and the first noise extracting unit 12, while the IF signal Sinb is inputted into the second noise extracting unit 16.

The first noise extracting unit 12 then extracts a noise mixed in the FM detection signal Sina to output a first noise signal Snza and supplies the noise signal to the noise hold unit 13.

On the other hand, a noise mixed in the IF signal Sinb passes through the second noise extracting unit 16 to act as a second noise signal Snzb, and is smoothed in the second noise smoothing unit 17 to become a second noise-smoothed signal Sdcb which is a DC signal and supplied to the noise hold control signal generating unit 18. Further, the second noise-smoothed signal Sdcb in the form of a DC signal is used as a threshold value and an amplitude change of the second noise signal Snzb is compared with the second noise-smoothed signal Sdcb, thereby detecting an occurring position and an occurring period of the noise mixed in the IF signal Sinb.

Then, in accordance with the noise hold control signal Shb indicating the noise hold period Tb equivalent to the noise occurring position and the noise occurring period detected by the noise hold control signal generating unit 18, the noise hold unit 13 performs a hold operation to hold the first noise signal Snza mixed in the FM detection signal Sina, and supplies the held noise signal Shnza having a result of the hold operation to the first noise smoothing unit 14, thereby generating a first noise-smoothed signal Sdca and supplying the signal to the hold control signal generating unit 15.

Here, once the noise hold unit 13 holds the first noise signal Snza in accordance with the noise hold control signal Shb, a strong noise portion (i.e., a noise portion having a large amplitude) of the first noise signal Snza will be removed, only a weak noise portion (i.e., a noise portion having a small amplitude) of the first noise signal Snza will be supplied as a held noise signal Shnza to the first noise smoothing unit 14.

Accordingly, in the first noise smoothing unit 14, the weak noise portion is smoothed to generate a first noise-smoothed signal Sdca which is a DC signal and supplied to the hold control signal generating unit 15.

Then, the hold control signal generating unit 15 operates to take, as a threshold value, the first noise-smoothed signal Sdca which is a DC signal, and to detect a first noise signal Snza having an amplitude larger than the threshold value, thereby generating a hold control signal Sha. Meanwhile, the hold control signal generating unit 15 allows the hold unit 11 to perform a hold operation during the hold period Ta specified by the hold control signal Sha, so as to hold the noise mixed in the FM detection signal Sina, thereby generating and thus outputting a noise-reduced FM detection signal Sout.

In this way, using the noise removal device 10 of the present embodiment, the second noise extracting unit 16 and the second noise smoothing unit 17 and the noise hold control signal generating unit 18 which are all in the second control path, can operate to detect a noise mixed in the IF signal Sinb, so as to generate a noise hold control signal Shb. Then, once the noise hold unit 13 holds the first noise signal Snza mixed in the FM detection signal Sina in accordance with the noise hold control signal Shb, a strong noise portion will be removed and a held noise signal Shnza representing only a weak noise portion will be supplied to the first noise smoothing unit 14.

Therefore, in the first noise smoothing unit 14, a weak noise portion is smoothed to generate a first noise-smoothed signal Sdca which is a DC signal, while the hold control signal generating unit 15 takes the first noise-smoothed signal Sdca as a threshold value and compares the first noise signal Snza with such a threshold value, thereby making it possible to individually and precisely detect an occurring position and an occurring period of each noise, without having to distinguish a strong noise portion of the first noise signal Snza from a weak noise portion thereof. In other words, since the level of the first noise-smoothed signal Sdca does not rise under the influence of two or more noises currently mixed in the FM detection signal Sina, it becomes possible to individually and precisely detect an occurring position and an occurring period of each noise.

Subsequently, since the hold unit 11 holds a noise mixed in a signal in accordance with the hold control signal Sha generated based on the precisely detected noise occurring position and noise occurring period, it is possible to generate an FM detection signal Sout whose noise has been properly removed.

In this way, when the noise removal device 10 of the present embodiment is used to remove an external noise such as an ignition noise generated from an electronic device of an automobile during a reception of a radio broadcast, such a noise removal device can provide an excellent effect of noise removal.

In addition, although the noise removal device 10 of the present embodiment can provide an excellent effect by being installed in a vehicle radio receiver, the use of this device should not be limited to vehicle radio receiver. In fact, this noise removal device can also provide an excellent noise removal effect if it is installed in a stationary radio receiver such as a home radio receiver, or a mobile radio receiver which is not a vehicle radio receiver.

As described above, the noise removal device 10 of the present embodiment can operate to generate a hold control signal Sha for holding a noise currently mixed in the FM detection signal Sina, based on a noise currently mixed in an IF signal Sinb outputted from a frequency converter provided in a radio receiver or the like, as well as another noise currently mixed in an FM detection signal Sina outputted from an FM detector. However, it is also possible for the noise removal device 10 of the present embodiment to be used as a noise removal device which utilizes noises mixed in respective signals generated in two positions within the radio receiver and removes a noise mixed in a signal generated in only one of the two positions.

Moreover, the use of the noise removal device 10 of the present embodiment should not be limited to a radio receiver, but is also suitable for use in a television receiver and various other kinds of receivers, all exhibiting an excellent noise removal effect.

Embodiment 1

Figure 4:
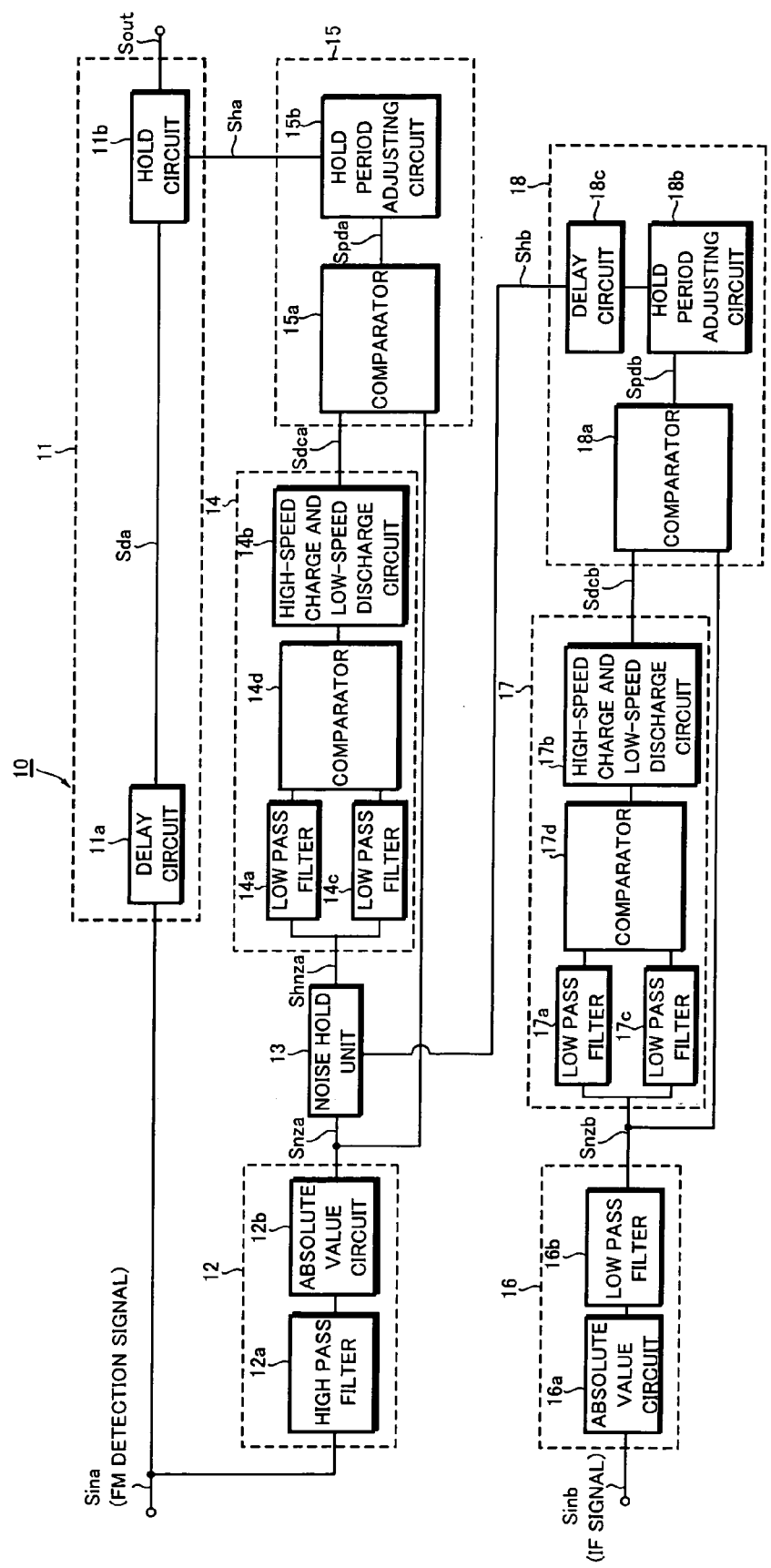
FIG. 4 is a block diagram showing the composition of a noise removal device formed according to Embodiment 1 of the present invention.
Figure 5:
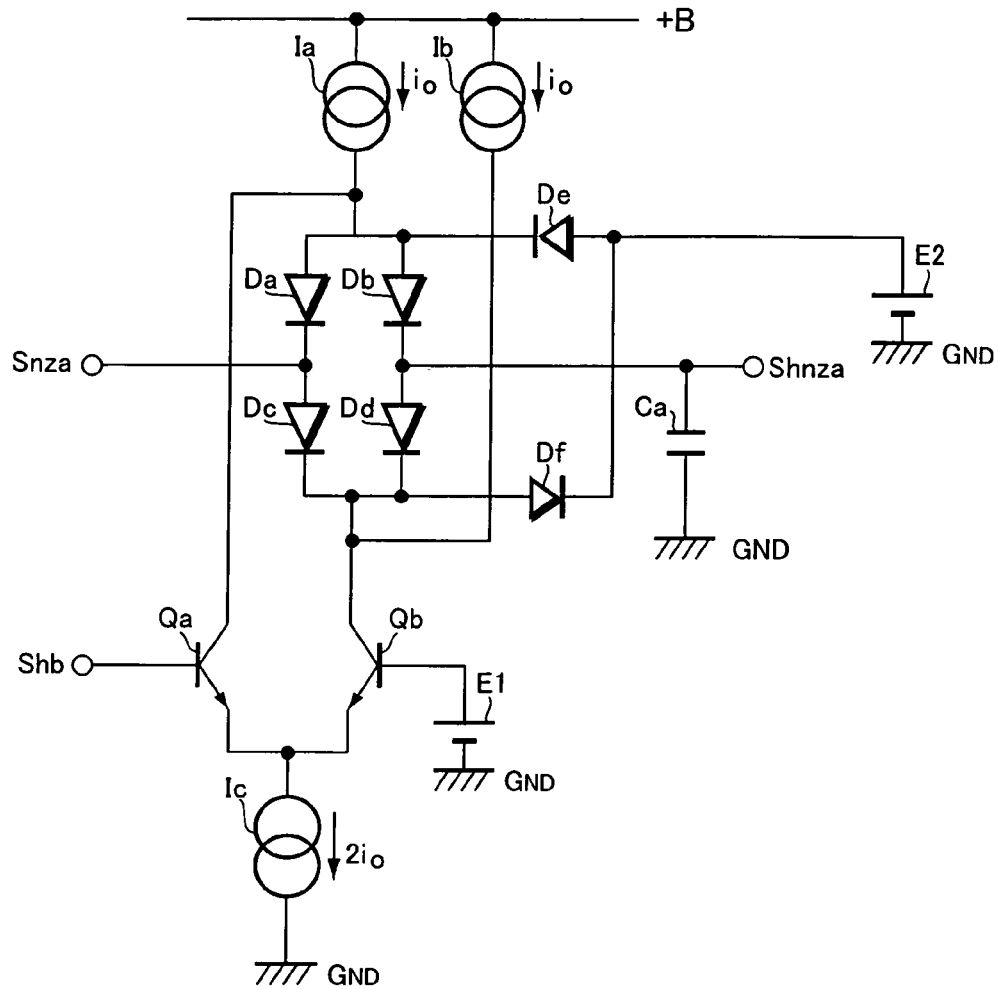
FIGS. 5(a) and 5(b) show detailed compositions of a noise hold unit and a hold unit.
Figure 5:
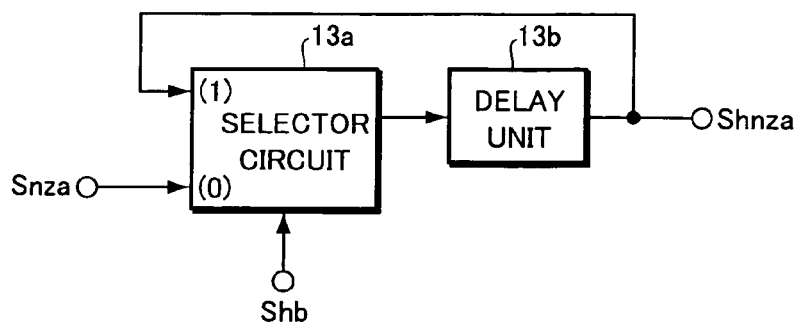
Figure 6:
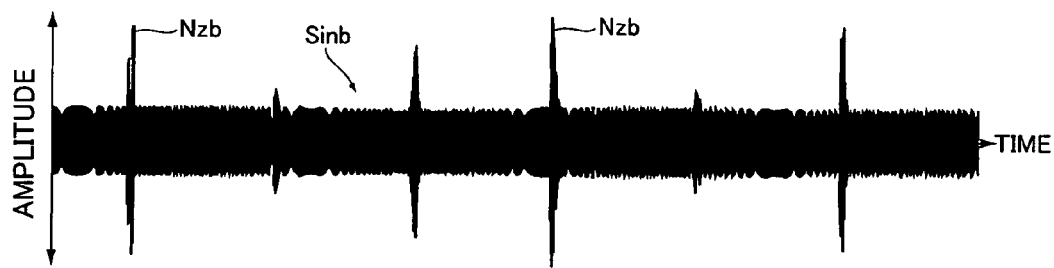
FIGS. 6(a) to 6(c) are waveform charts for explaining an operation of the noise removal device shown in FIG. 4.
Figure 6:
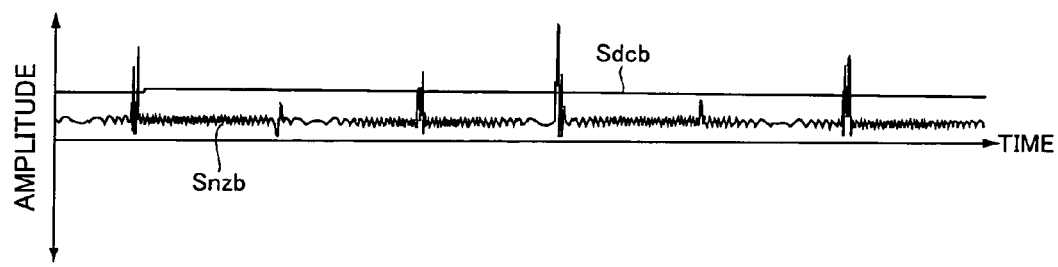
Figure 6:
Figure 7:
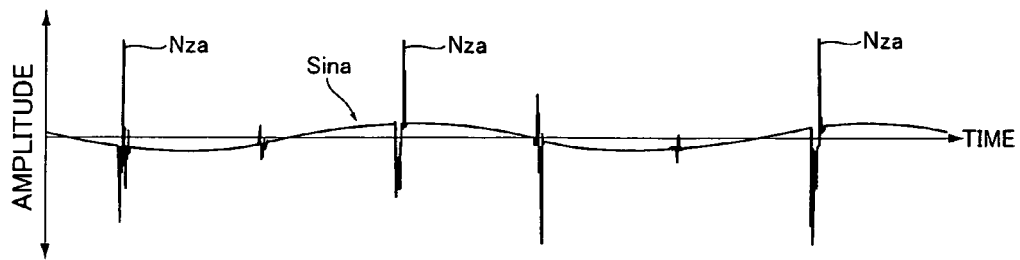
FIGS. 7(a) to 7(e) are waveform charts for further explaining an operation of the noise removal device shown in FIG. 4.
Figure 7:
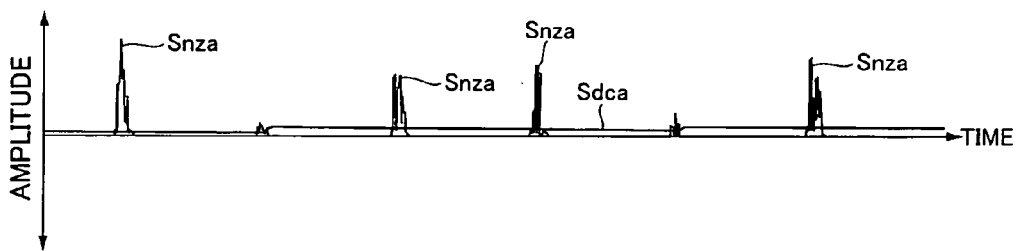
Figure 7:
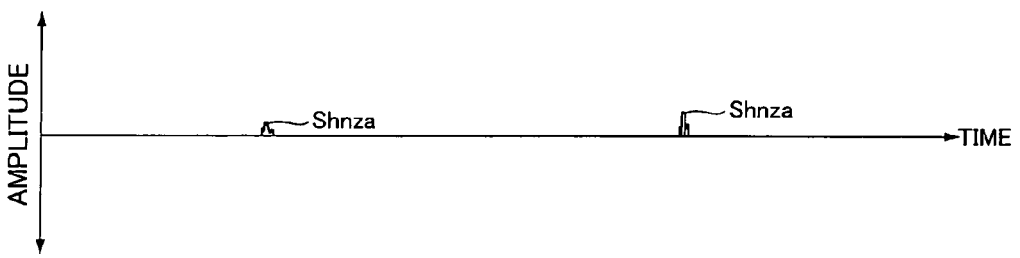
Figure 7:
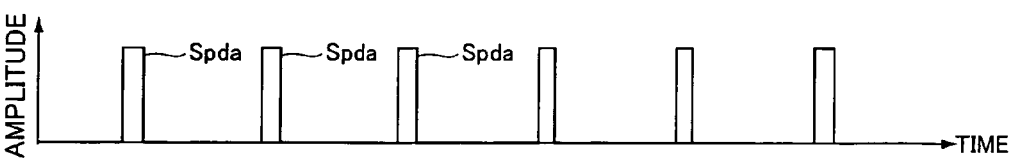
Figure 7:
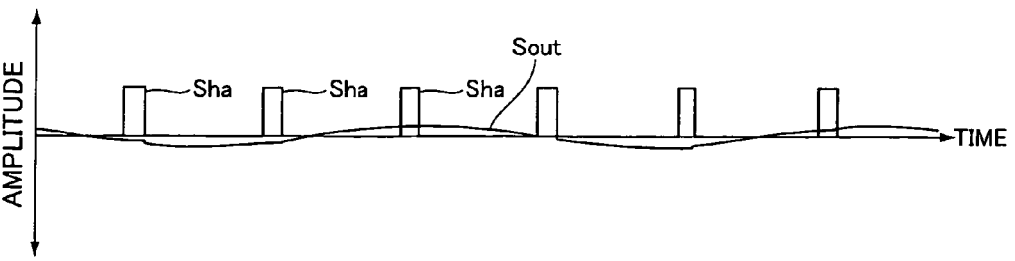

Next, description will be given to explain some more detailed embodiments of the present invention with reference to FIGS. 4-7. FIG. 4 is a block diagram showing the composition of a noise removal device formed according to Embodiment 1, with elements identical or equivalent to those in FIG. 3 represented by the same reference numerals. FIG. 5 shows the composition of a noise hold unit, FIGS. 6, 7 are waveform charts showing the waveforms of the signals generated in various elements of the noise removal device.

As shown in FIG. 4, a noise removal device represented by a reference numeral 10 is similar to that shown in FIG. 3 and comprises: i) a hold unit 11 provided in the main path of the noise removal device; ii) a first noise extracting unit 12, a noise hold unit 13, a first noise smoothing unit 14, and a hold control signal generating unit 15, which are provided in a first control path; iii) a second noise extracting unit 16, a second noise smoothing unit 17, and a noise hold control signal generating unit 18, which are provided in a second control path.

An FM detection signal (composite signal) Sina outputted from an FM detector (not shown) is supplied to the main path as well as to the first control path, while an intermediate frequency signal (IF signal) Sinb of a baseband outputted from a frequency converter (not shown) is supplied to the second control path.

The hold unit 11 includes a delay circuit 11a and a hold circuit 11b. The delay circuit 11a receives an FM detection signal Sina and then outputs the same in accordance with the delay times of the first and second control paths. The hold circuit 11b holds a delayed FM detection signal Sda in the hold period Ta specified by a hold control signal Sha which will be discussed later, thereby producing a noise-reduced FM detection signal Sout.

The first noise extracting unit 12 includes a high pass filter 12a and an absolute value circuit 12b. The high pass filter 12a receives an FM detection signal Sina, inhibits a signal component of the FM detection signal Sina and passes a noise component currently mixed in a high frequency band having a frequency higher than the signal component. The absolute value circuit 12b carries out an absolute value conversion on a noise component which has passed through the high pass filter 12a, so as to convert the noise component into a positive value amplitude, thereby generating and thus outputting a first noise signal Snza in the form of an absolute value.

The noise hold unit 13 is formed by a hold circuit which holds the first noise signal Snza in a noise hold period Tb specified by the noise hold control signal Shb of a predetermined level which will be discussed later, thereby outputting a held noise signal Shnza.

More specifically, the noise hold unit 13 is in the form of a circuit shown in FIG. 5(a). Namely, the noise hold unit 13 has NPN transistors Qa and Qb which are connected to constant current circuits Ia, Ib, and Ic interposed between a power voltage terminal (+B) and a ground terminal (GND), thereby forming a differential pair. The noise hold unit 13 also includes: switching diodes Da, Db, Dc, Dd, De, and Df connected between the collector of one NPN transistor Qb and the constant current circuit Ia; a condenser Ca; and voltage sources E1 and E2 for establishing a DC bias for the circuit.

Here, both of the constant current circuits Ia and Ib are set at the same constant current io, while the constant current circuit Ic is set at a constant current which is equal to a total current (2×io) of the constant currents io of the constant current circuits Ia and Ib. Further, the voltage source E1 is set at an appropriate DC voltage (reference voltage) for establishing a base bias for the NPN transistor Qb, while the voltage source E2 is set at a voltage equal to the DC bias potential of the absolute value circuit 12b. In this way, the potential at the junction point of the switching diodes De and Df can be kept equal to the DC bias potential of the absolute value circuit 12b.

Then, the noise hold control signal Shb is inputted into the base of the NPN transistor Qa, the first noise signal Snza from the absolute value circuit 12b is inputted into the junction point of switching diodes Da and Dc, and the held noise signal Shnza generated at the junction point of switching diodes Db, Dd and the condenser Ca is outputted to the first noise smoothing unit 14.

In the noise hold unit 13 having the above-described composition, once the noise hold control signal Shb is at a low level indicating a period other than the noise hold period Tb, the NPN transistor Qa will be ON and the NPN transistor Qb will be OFF. Further, the switching diodes Da, Db, Dc, and Dd will become conductive (ON) and the switching diodes De and Df will become non-conductive (OFF). In this way, the first noise signal Snza is inputted into the condenser Ca through the switching diodes Da, Db, Dc, and Dd, and then outputted to the first noise smoothing unit 14 as a held noise signal Shnza.

On the other hand, once the noise hold control signal Shb is at a high level indicating a noise hold period Tb, the NPN transistor Qa will be ON and the NPN transistor Qb will be OFF. Further, the switching diodes Da, Db, Dc, and Dd will become non-conductive (OFF) and the switching diodes De and Df will become conductive (ON). In this way, the inputting of the first noise signal Snza is intercepted and the potential of the condenser Ca is kept at a pre-interception voltage value, so that the held noise signal Shnza having the pre-interception voltage value is outputted to the first noise smoothing unit 14.

In this way, the noise hold unit 13 operates to input the first noise signal Snza or intercept such an inputting in response to a level change of the noise hold control signal Shb, thereby outputting a held noise signal Shnza in which the first noise signal Snza has been held.

In more detail, the first noise smoothing unit 14 comprises a low pass filter 14a, a second low pass filter 14c, a comparator 14d, and a high-speed charge and low-speed discharge circuit 14b. The low pass filter 14a has a quick response characteristic which causes a peak value of the held noise signal Shnza fed from the noise hold unit 13 to become a certain fraction (⅙ to ½). The second low pass filter 14c has a response characteristic which is greatly slower than that of the low pass filter 14a. The comparator 14d performs a comparison between the outputs of the two low pass filters 14a and 14c, thereby selecting and thus outputting an output signal having a higher level. The high-speed charge and low-speed discharge circuit 14b operates to smoothen the output (noise component) of the comparator 14d so as to generate a first noise-smoothed signal Sdca which is a DC signal.

Here, the high-speed charge and low-speed discharge circuit 14b is formed by an electric charge/discharge circuit which is quick in its charge and slow in its discharge with respect to an amplitude change of a noise component outputted from a comparator 14d. In this way, it is possible to perform a smoothing process following the amplitude change of the noise component fed from the comparator 14d.

The hold control signal generating unit 15 comprises a comparator 15a and a hold period adjusting circuit 15b. The comparator 15a takes the first noise-smoothed signal Sdca as a threshold value and compares an amplitude of the first noise signal Snza with such a threshold value, and outputs a detection signal Spda which will be reversed to a high level in a period τa during which the first noise signal Shnza has a large amplitude. The hold period adjusting circuit 15b operates to add a predetermined adjusting time Δτa to the foregoing period τa of the detection signal Spda outputted from the comparator 15a, so as to finely adjust the hold period Ta to a time width (τa+Δτa), thereby generating a hold control signal Sha.

Afterwards, the hold circuit 11b holds the FM detection signal Sda in the hold period Ta specified by the hold control signal Sha, and outputs a noise-reduced FM detection signal Sout.

In fact, the hold circuit 11b has the same composition as the noise hold unit 13 shown in FIG. 5(a). Namely, as shown in FIG. 5(a), the hold circuit 11b is formed in a manner such that a hold control signal Sha is supplied to the base of the NPN transistor Qa, an FM detection signal Sda fed from the delay circuit 11a is supplied to the junction point of switching diodes Da and Dc, thereby outputting a noise-reduced FM detection signal Sout from the junction point of the switching diodes Db, Dd and the condenser Ca.

Next, the second noise extracting unit 16 provided in the second control path includes an absolute value circuit 16a and a low pass filter 16b. The absolute value circuit 16a generates and thus outputs an absolute value IF signal (not represented by any reference numeral) by performing an absolute value conversion on an IF signal Sinb so as to convert the IF signal into a positive value amplitude. The low pass filter 16b performs a low-pass filtering on the absolute value IF signal so as to inhibit the passing of the IF signal and its high frequency component, but allow the passing of other noise components, thereby outputting a second noise signal Snzb.

The second noise smoothing unit 17 comprises a low pass filter 17a for low-pass filtering the second noise signal Snzb, a second low pass filter 17c having a sufficiently slower response characteristic than the response characteristic of the low pass filter 17a, a comparator 17d for performing a comparison between the two outputs of the two low pass filters 17a and 17c, and a high-speed charge and low-speed discharge circuit 17b for generating and thus outputting a second noise-smoothed signal Sdcb by smoothing the output of the comparator 17d. Similar to the foregoing high-speed charge and low-speed discharge circuit 14b in the first control path, the high-speed charge and low-speed discharge circuit 17b can perform a high-speed charge and low-speed discharge.

The noise hold control signal generating unit 18 comprises a comparator 18a, a hold period adjusting circuit 18b, and a delay circuit 18c. The comparator 18a takes the second noise-smoothed signal Sdcb as a threshold value and compares the amplitude of the second noise signal Snzb with such a threshold value, and outputs a detection signal Spdb which will be reversed to a high level in a period τb during which the second noise signal Snzb has a large amplitude. The hold period adjusting circuit 18b operates to add a predetermined adjusting time Δτb to the foregoing period τb of the detection signal Spdb outputted from the comparator 18a, so as to finely adjust the hold period Tb to a time width (τb+Δτb), thereby generating a hold control signal Shb. The delay circuit 18c is provided to adjust the processing periods of the first and second control paths. Further, the delay circuit 181c operates to delay the noise position control signal Shb and to supply the delayed noise position control signal Shb to the noise hold unit 13.

Next, description will be given to explain an operation example of the noise removal device 10 having the above-described composition, with reference to FIG. 6 and FIG. 7.

However, the following description is based on an assumption that the noise removal device 10 is provided in a vehicle radio receiver, an IF signal Sinb containing an ignition noise Nzb as shown in FIG. 6(a) is outputted from a frequency converter, while an IF signal Sinb containing an ignition noise Nza as shown in FIG. 7(a) is outputted from an FM detector.

Once an IF signal Sinb is supplied, the absolute value circuit 16a and the low pass filter 16b, which together form the second noise extracting unit 16, will operate to perform an absolute value conversion on the noise Nzb currently mixed in the IF signal Sinb so as to extract the noise, thereby outputting the second noise signal Snzb as shown in FIG. 6(b). Meanwhile, the low pass filter 17a as well as the high-speed charge and low-speed discharge circuit 17b, which together constitute the second noise smoothing unit 17, will operate to convert the second noise signal Snzb into a second noise-smoothed signal Sdcb which is a DC signal and then output the converted signal. Then, the comparator 18a which forms a part of the noise hold control signal generating unit 18 compares the second noise-smoothed signal Sdcb with the second noise signal Snzb, while the hold period adjusting circuit 18b finely adjusts the detection signal Spdb which is a result of the above comparison, thereby generating the noise hold control signal Shb as shown in FIG. 6(c) which indicates an occurring position and an occurring period of an ignition noise Nzb, and supplying the noise hold control signal Shb to the noise hold unit 13 through the delay circuit 18c.

On the other hand, once an FM detection signal Sina is supplied in synchronism with an IF signal Sinb, the high pass filter 12a and the absolute value circuit 12b, which together form the first noise extracting unit 12, will extract an ignition noise Nza currently mixed in the FM detection signal Sina, and perform an absolute value conversion on the extracted ignition noise Nza, thereby outputting a first noise signal Snza as shown in FIG. 7(b). Further, the noise hold unit 13 holds the first noise signal Snza in accordance with the noise hold control signal Shb, thereby outputting a held noise signal Shnza as shown in FIG. 7(c). Subsequently, the low pass filter 14a as well as the high-speed charge and low-speed discharge circuit 14b, which form a part of the first noise smoothing unit 14, will operate to smoothen the held noise signal Shnza and output a first noise-smoothed signal Sdca.

Afterwards, the comparator 15a, which forms a part of the hold control signal generating unit 15, compares the first noise-smoothed signal Sdca with the first noise signal Snza, while the hold period adjusting circuit 15a finely adjusts the detection signal Spda which is a result of the above comparison as shown in FIG. 7(d), thereby generating a noise hold control signal Sha as shown in FIG. 7(e) which indicates an occurring position and an occurring period of an ignition noise Nza. Then, the hold unit 11b, during a hold period Ta specifed by the hold control signal Sha, operates to hold the FM detection signal fed from the delay circuit 11a, thereby outputting an FM detection signal Sout free from an ignition noise Nza.

As described above, according to the noise removal device 10 of the present embodiment, the second noise extracting unit 16, the second noise smoothing unit 17, and the noise hold control signal generating unit 18, which are all located in the second control path, will operate to detect a noise currently mixed in an IF signal Sinb to generate a noise hold control signal Shb. Then, once the noise hold unit 13 holds the first noise signal Snza mixed in the FM detection signal Sina in accordance with the noise hold control signal Shb, a strong noise portion will be removed and a held noise signal Shnza containing only a weak noise portion will be supplied to the first noise smoothing unit 14.

For this reason, in the first noise smoothing unit 14, a weak noise portion will be smoothed and a first noise-smoothed signal Sdca which is a DC signal having a low level will be generated. Further, the hold control signal generating unit 15 takes the first noise-smoothed signal Sdca as a threshold value and compares the first noise signal Snza with such a threshold value, so that it is possible to individually and precisely detect an occurring position and an occurring period of each noise, without having to distinguish a strong noise portion and a weak noise portion of the first noise signal Snza. Namely, since the level of the first noise-smoothed signal Sdca does not rise in response to an influence of two or more noises currently mixed in the FM detection signal Sina, it is possible to detect the occurring position and the occurring period of a noise having a low amplitude, thereby rendering it possible to individually and accurately detect the occurring position and the occurring period of each noise.

Then, since the hold unit 11 holds a noise mixed in an FM detection signal in accordance with a hold control signal Sha generated based on the accurately detected noise occurring position and noise occurring period, it is possible to produce an FM detection signal Sout from which noise has been properly removed.

As described above, the noise removal device 10 of the present embodiment has a second noise smoothing unit 17 including a low pass filter 17a as well as a high-speed charge and low-speed discharge circuit 17b, so that it is possible to generate a second noise-smoothed signal Sdcb having an extremely stable DC level, and to accurately detect the occurring position and the occurring period of a noise Nzb mixed in an IF signal Sinb. However, it is also possible to omit the high-speed charge and low-speed discharge circuit 17b if such an omission has been made necessary in view of a designed specification of a radio receiver or an actually used environment, thereby supplying the output of the low pass filter 17a directly to the comparator 18a.

Moreover, the noise removal device 10 of the present embodiment should not be limited to the use for removing an ignition noise generated in an automobile electronic device or the like during a reception of a radio broadcast. In fact, it is also possible for the noise removal device to be used for removing other sorts of noises.

Further, the noise removal device 10 of the present embodiment should not be limited to the use for processing an FM detection signal Sina, but is also possible for removing pulse-like noises mixed in various signals generated in a radio receiver. For example, the output of a frequency converter can be connected to a noise removal device having technical functions of the same level as the noise removal device 10 of the present embodiment, so as to remove pulse-like noise mixed in intermediate frequency signal (IF signal) before being detected. In addition, it is also possible to remove a pulse-like noise mixed in a detected and demodulated audio signal for driving a speaker.

Namely, the noise removal device 10 of the present embodiment can operate to generate the hold control signal Sha for holding a noise currently mixed in an FM detection signal Sina, based on a noise currently mixed in an IF signal Sinb outputted from a frequency converter provided in a radio receiver or the like, and also based on a noise currently mixed in an FM detection signal Sina outputted from an FM detector. On the other hand, the device of the present embodiment can also be used as a noise removal device which utilizes noises mixed in respective signals generated in two positions within a radio receiver and removes a noise mixed in a signal generated in only one of the two positions.

Moreover, although the noise removal device 10 of the present embodiment can exhibit an excellent advantage by being provided in a vehicle radio receiver, the use of the device should not be limited as such. In fact, this noise removal device can also exhibit an excellent noise reducing effect even when it is used in a home electronic device such as a stationary radio receiver or a mobile radio receiver which is not installed in a vehicle.

Further, the use of the noise removal device 10 of the present embodiment should not be limited to a radio receiver, but is also suitable for a television set or other various receivers, thereby exhibiting an excellent noise reducing effect.

Moreover, although the above description has been given based on an embodiment in which the noise removal device 10 is formed by an analog circuit and the noise removal is carried out by performing an analog signal processing, it is also possible for a noise removal device to be formed by a digital circuit which performs the noise removal by digital signal processing.

When forming the noise removal device 10 by a digital circuit, it is possible for the noise hold unit 13 to be formed by a circuit shown in FIG. 5(b), rather than a circuit shown in FIG. 5(a). Namely, the noise hold unit 13 can be formed by a circuit including a two-input one-output selector circuit 13a and a delay unit 13b connected in series with the selector circuit 13a. In this way, the first noise signal Snza which has been A/D converted into digital data is supplied to one input terminal of the selector circuit 13a, while the output of the delay unit 13b is fed back and supplied to the other input terminal of the selector circuit 13a. Further, the selector circuit 13a is switched in accordance with the noise hold control signal Shb. Once the noise hold control signal Shb is at its low level during a period other than the hold period Tb, the first noise signal Snza will be transmitted to the delay unit 13b. On the other hand, once the noise hold control signal Shb is at its high level during the hold period Tb, the inputting of the first noise signal Snza is intercepted and the feedback output from the delay unit 13b is transmitted back to the delay unit 13b. Furthermore, the delay period of the delay unit 13b is set such that it is an inverse number of a sampling frequency (a sampling frequency higher than a so-called Nyquist frequency) for A/D converting the FM detection signal Sina into digital data FM detection signal.

In the noise hold unit 13 having the above-described composition which is a digital circuit, once the noise hold control signal Shb is at its low level during a period other than the noise hold period Tb, the first noise signal Snza will be transmitted to the delay unit 13b through the selector circuit 13a and will be outputted as a held noise signal Shnza. On the other hand, once the noise hold control signal Shb is at its high level during the noise hold period Tb, an inputting of the first noise signal Snza will be intercepted. Meanwhile, a pre-delay noise hold control signal, i.e., a held noise hold control signal will be outputted from the delay unit 13b as a held noise signal Shnza.

In this way, when forming the noise removal device 10 by a digital circuit, if the noise hold unit 13 is formed by a circuit shown in FIG. 5(b), inputting or intercepting of the first noise signal Snza in response to a level change of the noise hold control signal Shb makes it possible to hold the first noise signal Snza and to output the same as a held noise signal Shnza.

Moreover, the hold circuit 11b is formed by having the same composition as the noise hold unit 13 shown in FIG. 5(b). Namely, rather than the first noise signal Snza, an FM detection signal Sda outputted from the delay circuit 11a as digital data is supplied to the selector circuit. Meanwhile, a switching operation is performed in accordance with the hold control signal Sha rather than the noise hold control signal Shb.

Embodiment 2

Figure 8:
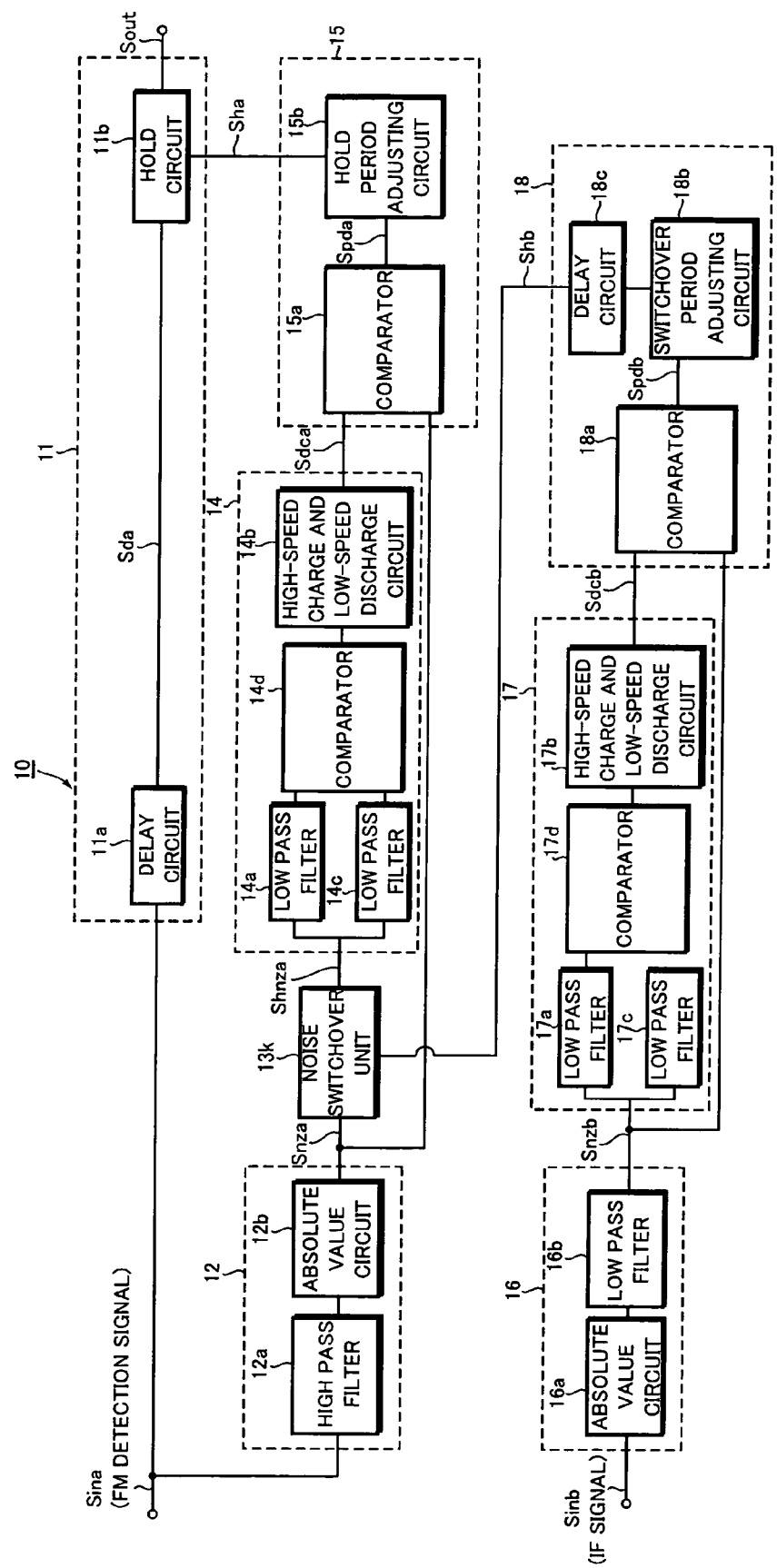
FIG. 8 is a block diagram showing the composition of a noise removal device formed according to Embodiment 2 of the present invention.
Figure 9:
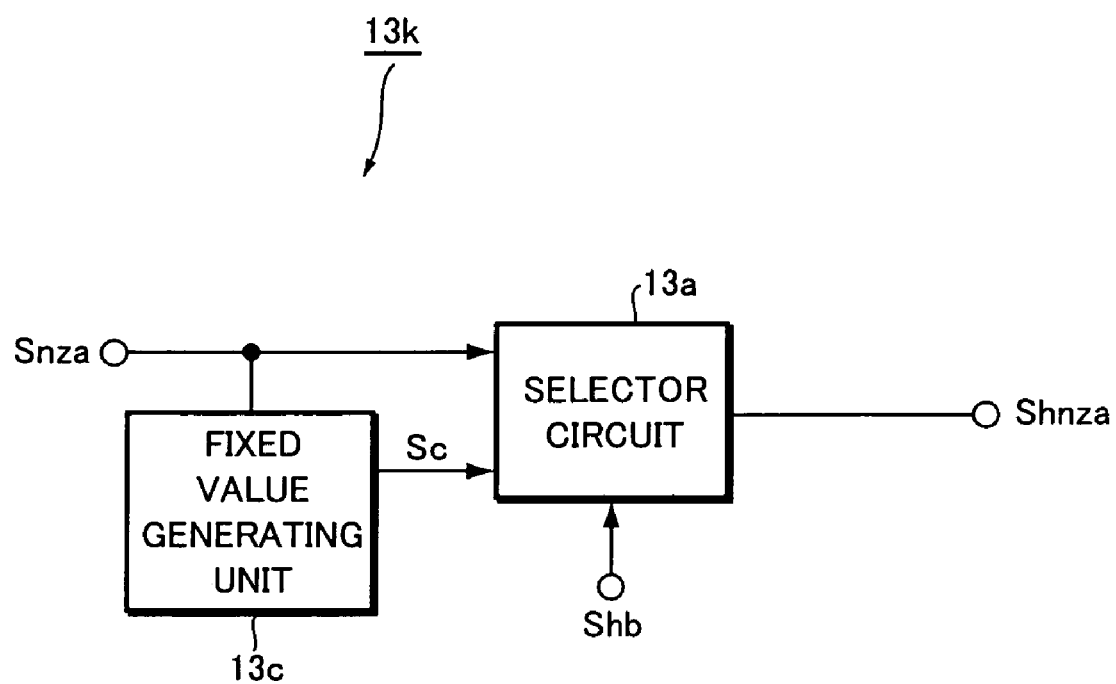
FIG. 9 is a block diagram showing the composition of a noise switchover unit.
Figure 10:
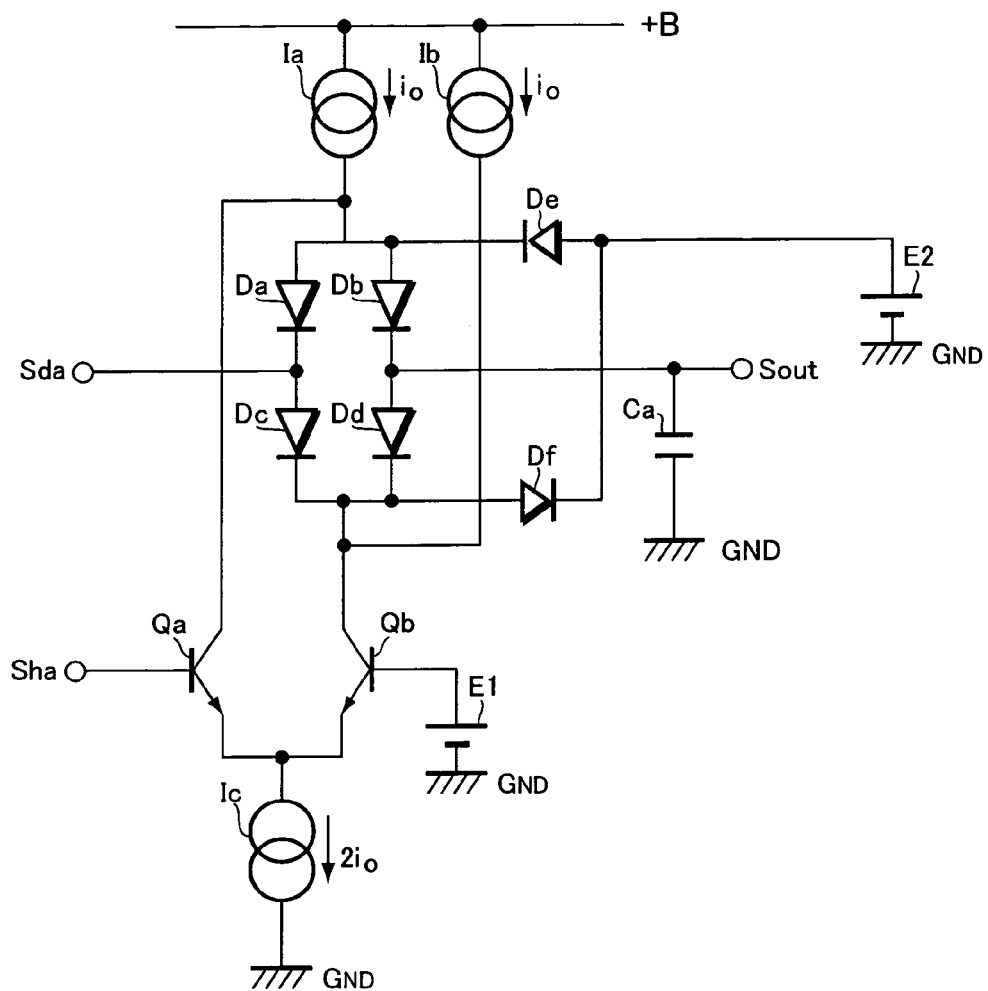
FIGS. 10(a) and 10(b) show a detailed composition of a hold unit.
Figure 10:
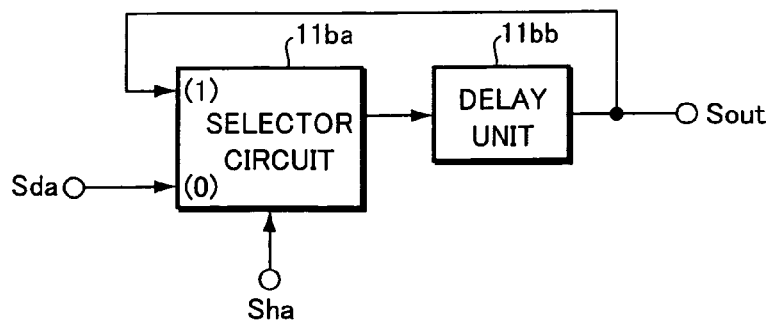

Next, description will be given to explain Embodiment 2 with reference to FIGS. 8-10. FIG. 8 is a block diagram showing the composition of a noise removal device formed according to the present embodiment. However, the elements of this embodiment which are identical with or equivalent to those in FIG. 3 and FIG. 4 are represented by the same reference numerals. FIG. 9 is also a block diagram showing the composition of a noise switchover unit. FIG. 10 shows the composition of a hold circuit 11b.

As shown in FIG. 8, the noise removal device represented by a reference numeral 10 comprises: i) a hold unit 11 provided in the main path of the noise removal device; ii) a first noise extracting unit 12, a noise switchover unit 13k, a first noise smoothing unit 14, and a hold control signal generating unit 15, which are provided in a first control path; iii) a second noise extracting unit 16, a second noise smoothing unit 17, and a noise switchover control signal generating unit 18k, which are provided in a second control path. In fact, the noise removal device of the present embodiment is formed by replacing the noise hold unit 13 and the noise hold control signal generating unit 18 of Embodiment 1 shown in FIG. 4 with the noise switchover unit 13k and the noise switchover control signal generating unit 18k.

An FM detection signal (composite signal) Sina outputted from an FM detector (not shown) is supplied to the main path as well as to the first control path, while an intermediate frequency signal (IF signal) Sinb of a baseband outputted from a frequency converter (not shown) is supplied to the second control path.

The hold unit 11 includes a delay circuit 11a and a hold circuit 11b. The delay circuit 11a receives an FM detection signal Sina and then outputs the same in accordance with the delay periods of the first and second control paths. The hold circuit 11b holds a delayed FM detection signal Sda in the hold period Ta specified by a hold control signal Sha which will be discussed later, thereby producing a noise-reduced FM detection signal Sout.

The first noise extracting unit 12 includes a high pass filter 12a and an absolute value circuit 12b. The high pass filter 12a receives an FM detection signal Sina, inhibits a signal component of the FM detection signal Sina and passes a noise component currently mixed in a high frequency band having a frequency higher than the signal component. The absolute value circuit 12b carries out an absolute value conversion on a noise component which has passed through the high pass filter 12a, so as to convert the noise component into an amplitude having a positive value, thereby generating and thus outputting a first noise signal Snza having an absolute value.

The noise switchover unit 13k is formed by a switchover circuit which switches the first noise signal Snza over to a fixed value fed from a fixed value generating unit 13c which will be discussed later, in a noise switchover period Tb specified by a noise switchover control signal Shb having a predetermined level which will also be discussed later, thereby outputting a switched noise signal Shnza.

More specifically, the noise switchover unit 13k is formed by a circuit shown in FIG. 9. Namely, the noise switchover unit 13k has a two-input one-output selector circuit 13a and a fixed value generating unit 13c. The fixed value generating unit 13c generates, from the first noise signal Snza, a fixed value Sc which is zero or a value smaller than the component value of the first noise signal Snza when reception signal is sufficiently strong, or a value smaller than the first noise signal Snza existing just before a switchover operation. Further, the selector circuit 13a is so formed that the first noise signal Snza is supplied to one input terminal of the selector circuit 13a, while the fixed value Sc fed from the fixed value generating unit 13c is supplied to the other input terminal of the selector circuit 13a.

When a switchover operation of the selector circuit 13a is performed in accordance with a noise switchover control signal Shb and a noise switchover control signal Shb is at its low level during a period other than the switchover period Tb, the first noise signal Snza will be outputted. On the other hand, when the noise switchover control signal Shb is at its high level during the switchover period Tb, the inputting of the first noise signal Snza will be intercepted and the above-mentioned fixed value Sc is outputted.

In this way, the noise switchover unit 13 performs a switchover between the input of the first noise signal Snza and the fixed value Sc in response to a level change of the noise switchover control signal Shb, thereby outputting a noise-switched signal Shnza containing both the first noise signal Snza and the fixed value Sc.

The first noise smoothing unit 14 comprises a low pass filter 14a, a second low pass filter 14c, a comparator 14d, a high-speed charge and low-speed discharge circuit 14b. The low pass filter 14a has a quick response characteristic which causes a peak value of the switched noise signal Shnza fed from the noise switchover unit 13k to become a certain fraction (⅙ to ½). The second low pass filter 14c has a response characteristic which is greatly slower than that of the low pass filter 14a. The comparator 14d performs a comparison between the outputs of the two low pass filters 14a and 14c, thereby selecting and thus outputting an output signal having a higher level. The high-speed charge and low-speed discharge circuit 14b operates to smoothen the output (noise component) of the comparator 14d so as to generate a first noise-smoothed signal Sdca which is a DC signal.

Here, the high-speed charge and low-speed discharge circuit 14b is formed by an electric charge/discharge circuit which is quick in its charge and slow in its discharge with respect to an amplitude change of a noise component outputted from the comparator 14d. In this way, it is possible to perform a smoothing process following an amplitude change of the noise component fed from the comparator 14d.

The hold control signal generating unit 15 comprises a comparator 15a and a hold period adjusting circuit 15b. The comparator 15a takes the first noise-smoothed signal Sdca as a threshold value and compares an amplitude of the first noise signal Snza with such a threshold value, and outputs a detection signal Spda which will be reversed to a high level in a period τa during which the first noise signal Shnza has a large amplitude. The hold period adjusting circuit 15b operates to add a predetermined adjusting time Δτa to the foregoing period τa of the detection signal Spda outputted from the comparator 15a, so as to finely adjust the hold period Ta to a time width (τa+Δτa), thereby generating a hold control signal Sha.

Afterwards, the hold circuit 11b holds the FM detection signal Sda in the hold period Ta specified by the hold control signal Sha, and outputs a noise-reduced FM detection signal Sout.

More specifically, the hold circuit 11b is formed by a circuit shown in FIG. 10(a). Namely, the hold circuit 11b comprises: i) NPN transistors Qa and Qb which form a differential pair and are connected to constant current circuits Ia, Ib, and Ic interposed between a power source voltage terminal (+B) and a ground terminal (GND); ii) switching diodes Da, Db, Dc, Dd, De, and Df connected between the collector of one NPN transistor Qb and the constant current circuit 1a; iii) a condenser Ca; and iv) voltage sources E1 and E2 for setting a DC bias for the circuit.

Here, both of the constant current circuits Ia and Ib are set at the same constant current io, while the constant current circuit Ic is set at a constant current which is equal to a total current (2×io) of the constant currents io of the constant current circuits Ia and Ib. Further, the voltage source E1 is set at an appropriate DC voltage (reference voltage) for establishing a base bias of the NPN transistor Qb, while the voltage source E2 is set at a voltage equal to the DC bias potential of the delay circuit 11a. In this way, the potential of the junction point of the switching diodes De and Df can be kept equal to the DC bias potential of the delay circuit 11a.

Then, the hold control signal Sha is inputted into the base of the NPN transistor Qa, the signal Sda fed from the delay circuit 11a is inputted into the junction point of the switching diodes Da and Dc, and an FM detection signal Sout generated at the junction point of switching diodes Db, Dd and the condenser Ca is outputted.

In the hold circuit 11b having the above-described composition, once the hold control signal Sha is at its low level indicating a period other than the hold period Ta, the NPN transistor Qa will be OFF and the NPN transistor Qb will be ON. Further, the switching diodes Da, Db, Dc, and Dd become conductive (ON) and the switching diodes De and Df become non-conductive (OFF). In this way, an output signal Sda from the delay circuit 11a is inputted into the condenser Ca through the switching diodes Da, Db, Dc, and Dd, and is outputted as an FM detection signal Sout.

On the other hand, once the hold control signal Sha is at its high level indicating a noise hold period Ta, the NPN transistor Qa will be ON and the NPN transistor Qb will be OFF. Further, the switching diodes Da, Db, Dc, and Dd will become non-conductive (OFF) and the switching diodes De and Df will become conductive (ON). In this way, the inputting of the output signal Sda of the delay circuit 11a is intercepted and the potential of the condenser Ca is kept at a pre-interception voltage value, so that an output signal Sda (having a pre-interception voltage value) of the delay circuit 11a is outputted as an FM detection signal Sout.

In this way, the hold circuit 11b operates to input or intercept the output signal Sda of the delay circuit 11a in response to a level change of the hold control signal Sha, thereby outputting a noise-reduced FM detection signal Sout from the junction point of the switching diodes Db, Dd and the condenser Ca.

The second noise extracting unit 16 provided in the second control path comprises an absolute value circuit 16a and a low pass filter 16b. The absolute value circuit 16a generates and thus outputs an absolute value IF signal (not represented by any reference numeral) by performing an absolute value conversion on an IF signal Sinb so as to convert the IF signal into a positive value amplitude. The low pass filter 16b operates to perform a low-pass filtering on the absolute value IF signal so as to inhibit the passing of the IF signal and its high frequency component, but allow the passing of other noise components, thereby outputting a second noise signal Snzb.

The second noise smoothing unit 17 includes a low pass filter 17a for low-pass filtering the second noise signal Snzb, a second low pass filter 17c having a sufficiently slower response characteristic than the response characteristic of the low pass filter 17a, a comparator 17d for performing a comparison between the two outputs of the two low pass filters 17a and 17c, and a high-speed charge and low-speed discharge circuit 17b for generating and thus outputting a second noise-smoothed signal Sdcb by smoothing the output of the comparator 17d. Similar to the foregoing high-speed charge and low-speed discharge circuit 14b in the first control path, the high-speed charge and low-speed discharge circuit 17b can also perform a high-speed charge and low-speed discharge.

The noise switchover control signal generating unit 18k comprises a comparator 18a, a switchover period adjusting circuit 18b, and a delay circuit 18c. The comparator 18a takes the second noise-smoothed signal Sdcb as a threshold value and compares the amplitude of the second noise signal Snzb with such a threshold value, and outputs a detection signal Spdb which will be reversed to a high level in a period τb during which the second noise signal Snzb has a large amplitude. The switch over period adjusting circuit 18b operates to add a predetermined adjusting time Δτb to the foregoing period τb of the detection signal Spdb outputted from the comparator 18a, so as to finely adjust the noise switchover period Tb to a time width (τb+Δτb), thereby generating a switchover control signal Shb. The delay circuit 18c is provided to adjust the processing periods of the first and second control paths. Further, the delay circuit 18c operates to delay the noise position control signal Shb and to supply the delayed noise position control signal Shb to the noise switchover unit 13.

Next, description will be given to explain an operation example of the noise removal device 10 having the above-described composition, with reference to FIG. 8.

However, the following description is based on an assumption that the noise removal device 10 is provided in a vehicle radio receiver, an IF signal Sinb containing an ignition noise Nzb is outputted from a frequency converter, while an IF signal Sinb containing an ignition noise Nza is outputted from an FM detector.

Once an IF signal Sinb is supplied, the absolute value circuit 16a and the low pass filter 16b, together forming the second noise extracting unit 16, will operate to perform an absolute value conversion on the ignition noise Nzb currently mixed in the IF signal Sinb so as to extract the noise, thereby outputting a second noise signal Snzb. Meanwhile, the low pass filter 17a as well as the high-speed charge and low-speed discharge circuit 17b, together forming the second noise smoothing unit 17, will operate to convert the second noise signal Snzb into a second noise-smoothed signal Sdcb which is a DC signal and then output the converted signal. Then, the comparator 18a which forms a part of the noise switchover control signal generating unit 18k compares the second noise-smoothed signal Sdcb with the second noise signal Snzb, while the switchover period adjusting circuit 18b finely adjusts the detection signal Spdb which is a result of the above comparison, thereby generating the noise switchover control signal Shb indicating an occurring position and an occurring period of an ignition noise Nzb, and supplying the noise switchover control signal Shb to the noise switchover unit 13a through the delay circuit 18c.

On the other hand, once an FM detection signal Sina is supplied in synchronism with an IF signal Sinb, the high pass filter 12a and the absolute value circuit 12b, together forming the first noise extracting unit 12, extract an ignition noise Nza currently mixed in the FM detection signal Sina, and perform an absolute value conversion on the extracted ignition noise Nza, thereby outputting a first noise signal Snza. Further, in the selector circuit 13a of the noise switchover unit 13k and in accordance with the noise switchover control signal Shb, the first noise signal Snza is switched over to a fixed value Sc fed from the fixed value generating unit 13c, thereby outputting a switched noise signal Shnza. Subsequently, the two low pass filters 14a, 14c, and the comparator 14d as well as the high-speed charge and low-speed discharge circuit 14b, which together form the first noise smoothing unit 14, will operate to smoothen the switched noise signal Shnza and output a first noise-smoothed signal Sdca.

Afterwards, the comparator 15a, which forms a part of the hold control signal generating unit 15, compares the first noise-smoothed signal Sdca with the first noise signal Snza, while the hold period adjusting circuit 15a finely adjusts the detection signal Spda which is a result of the above comparison, thereby generating a noise hold control signal Sha indicating an occurring position and an occurring period of an ignition noise Nza. Then, the hold unit 11b, during a hold period Ta shown by the hold control signal Sha, will operate to hold the FM detection signal fed from the delay circuit 11a, thereby outputting an FM detection signal Sout free from an ignition noise Nza.

As described above, according to the noise removal device 10 of the present embodiment, the second noise extracting unit 16, the second noise smoothing unit 17, and the noise switchover control signal generating unit 18k, which are all located in the second control path, will operate to detect a noise currently mixed in an IF signal Sinb to generate a noise switchover control signal Shb. Then, the noise switchover unit 13 switches the first noise signal Snza mixed in the FM detection signal Sina over to a fixed value Sc in accordance with the noise switchover control signal Shb, so that a strong noise portion will be removed and a switched noise signal Shnza which is a mixture containing the fixed value Cs and a weak noise portion will be supplied to the first noise smoothing unit 14.

For this reason, in the first noise smoothing unit 14, a noise-free fixed value Sc and the remaining weak noise portion will be smoothed and a first noise-smoothed signal Sdca which is a DC signal having a low level will be generated. The hold control signal generating unit 15 takes the first noise-smoothed signal Sdca as a threshold value and compares the first noise signal Snza with such a threshold value, so that it is possible to individually and precisely detect the occurring position and the occurring period of each noise, without having to distinguish a strong noise portion and a weak noise portion of the first noise signal Snza.

At this time, since the noise-free fixed value Sc is set at a value smaller than a hold signal value of Embodiment 1, the first noise-smoothed signal Sdca which works as a threshold of noise detection becomes smaller than Embodiment 1, thereby making it possible to remove a smaller noise.

Namely, since the level of the first noise-smoothed signal Sdca does not rise in response to an influence of two or more noises currently mixed in the FM detection signal Sina, it is possible to detect the occurring position and the occurring period of a noise having a low amplitude, thereby making it possible to individually and accurately detect the occurring position and the occurring period of each noise.

Then, since the hold unit 11 holds a noise mixed in an FM detection signal in accordance with a hold control signal Sha generated based on the accurately detected noise occurring position and noise occurring period, it is possible to produce an FM detection signal Sout from which noise has been properly removed.

As described above, the noise removal device 10 of the present embodiment has the second noise smoothing unit 17 which comprises the two low pass filters 17*a*, 17*b* and the comparator 17*d* as well as the high-speed charge and low-speed discharge circuit 17*b*, so that it is possible to generate a second noise-smoothed signal Sdcb having an extremely stable DC level, and to accurately detect the occurring position and the occurring period of the noise Nzb mixed in the IF signal Sinb. On the other hand, it is also possible to omit the high-speed charge and low-speed discharge circuit 17*b* if such an omission has been made necessary in view of a designed specification of a radio receiver or an actually used environment, thereby supplying the output of the low pass filter 17*d* directly to the comparator 18*a*.

Moreover, the noise removal device 10 of the present embodiment should not be limited to the use for removing an ignition noise generated from an automobile electronic device or the like during a reception of a radio broadcast. In fact, it is also possible for the noise removal device to be used for removing other sorts of noises.

Further, the noise removal device 10 of the present embodiment should not be limited to the use for processing an FM detection signal Sina, but is also possible for use in removing pulse-like noises mixed in various signals generated in a radio receiver. For example, the output of a frequency converter can be connected to a noise removal device having technical functions of the same level as the noise removal device 10 of the present embodiment, so as to remove the pulse-like noises mixed in an intermediate frequency signal (IF signal) before being detected. In addition, it is also possible to remove a pulse-like noise mixed in a detected and demodulated audio signal for driving a speaker.

Namely, the noise removal device 10 of the present embodiment can operate to generate a hold control signal Sha for holding a noise currently mixed in an FM detection signal Sina, based on a noise currently mixed in an IF signal Sinb outputted from a frequency converter provided in a radio receiver or the like, as well as on a noise currently mixed in an FM detection signal Sina outputted from an FM detector. On the other hand, the device of the present embodiment can also be used as a noise removal device which utilizes noises mixed in respective signals generated in two positions within a radio receiver and removes a noise mixed in a signal generated in only one of the two positions.

Moreover, although the noise removal device 10 of the present embodiment can exhibit an excellent advantage by being provided in a vehicle radio receiver, the use of the device should not be limited as such. In fact, this noise removal device can also exhibit an excellent noise reducing effect when it is used in a home electronic device such as a stationary radio receiver or a mobile radio receiver which is not installed in a vehicle.

Further, the use of the noise removal device 10 of the present embodiment should not be limited to a radio receiver, but also suitable for use in a television set or other various receivers, thereby exhibiting an excellent noise reducing effect.

Moreover, although the above description has been given based on an embodiment in which the noise removal device 10 is formed by an analog circuit and the noise removal is carried out by performing an analog signal processing, it is also possible for a noise removal device to be formed by a digital circuit which performs the noise removal by digital signal processing.

When forming the noise removal device 10 by a digital circuit, it is possible for the hold unit 11*b* to be formed by a circuit shown in FIG. 10(*b*), rather than a circuit shown in FIG. 10(*a*). Namely, the hold unit 11*b* can be formed by a circuit including a two-input one-output selector circuit 11*ba* and a delay unit 11*bb* connected in series with the selector circuit 11*ba*. In this way, an output Sda of the delay circuit 11*a* which has been A/D converted into digital data is supplied to one input terminal of the selector circuit 11*ba*, while the output of the delay unit 11*bb* is fed back and supplied to the other input terminal of the selector circuit 11*ba*. Further, the selector circuit 11*ba* is switched in accordance with the hold control signal Sha. Once the hold control signal Sha is at its low level during a period other than the hold period Ta, an output signal Sda of the delay circuit 11*a* will be transmitted to the delay unit 11*bb*. On the other hand, once the hold control signal Sha is at its high level during the hold period Ta, the inputting of the output signal Sda of the delay circuit 11*a* is intercepted and the feedback output from the delay unit 11*bb* is transmitted back to the delay unit 11*bb*. Furthermore, the delay period of the delay unit 11*bb* is set such that it is an inverse number of a sampling frequency (a sampling frequency higher than a so-called Nyquist frequency) for A/D converting an FM detection signal Sina into digital data FM detection signal.

In the hold unit 11*b* having the above-described composition which is a digital circuit, once the hold control signal Sha is at its low level during a period other than the noise hold period Ta, the output signal Sda of the delay circuit 11*a* will be transmitted to the delay unit 11*bb* through the selector circuit 11*ba* and will be outputted as an FM detection signal Sout. On the other hand, once the hold control signal Shb is at its high level during the noise hold period Ta, the inputting of an output signal Sda of the delay circuit 11*a* will be intercepted. Meanwhile, the output signal Sda of the delay circuit 11a stored in the delay unit 11bb immediately before the interception is again transmitted as an output Sout to the delay unit 11bb through the selector circuit 11ba and stored therein, and outputted from the delay unit 11bb as a held FM detection signal Sout.

In this way, when forming a noise removal device 10 by a digital circuit, if the hold circuit 11b is formed by a circuit shown in FIG. 10(b), an inputting or intercepting of an output signal Sda of the delay circuit 11a in response to a level change of the hold control signal Sha makes it possible to hold the output signal of the delay circuit 11a and to output the same as an FM detection signal Sout.

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. A noise removal device for removing a noise mixed in a signal, said device comprising:
   first noise extracting means for extracting a noise currently mixed in a first input signal and outputting the noise as a first noise signal;
   second noise extracting means for extracting a noise currently mixed in a second input signal and outputting the noise as a second noise signal;
   second noise smoothing means for smoothing the second noise signal to generate a second noise-smoothed signal;
   noise hold control signal generating means which takes the second noise-smoothed signal as a threshold value and compares the second noise signal with the threshold value to detect an occurring position and an occurring period of the second noise signal and to generate a noise hold control signal having a hold period corresponding to a result of the detection;
   noise hold means for holding the first noise signal in accordance with the noise hold control signal to generate and thus output a held noise signal;
   first noise smoothing means for smoothing the held noise signal to generate a first noise-smoothed signal;
   hold control signal generating means which takes the first noise-smoothed signal as a threshold value and compares the first noise signal with the threshold value to detect an occurring position and an occurring period of the first noise signal and to generate a second noise hold control signal having a hold period corresponding to a result of the detection; and
   hold means for holding the first input signal in accordance with the second noise hold control signal to generate and thus output the first input signal not containing any noise.

2. The noise removal device according to claim 1, wherein the first noise smoothing means includes a high-speed charge and low-speed discharge circuit for carrying out a high-speed charge and a low-speed discharge in response to an amplitude change of the held noise signal, thereby generating the first noise-smoothed signal.

3. A noise removal device for removing a noise mixed in a signal, said device comprising:
   first noise extracting means for extracting a noise currently mixed in a first input signal and outputting the noise as a first noise signal;
   second noise extracting means for extracting a noise currently mixed in a second input signal and outputting the noise as a second noise signal;
   second noise smoothing means for smoothing the second noise signal to generate a second noise-smoothed signal;
   noise switchover control signal generating means which takes the second noise-smoothed signal as a threshold value and compares the second noise signal with the threshold value to detect an occurring position and an occurring period of the second noise signal and to generate a noise switchover control signal having a switchover period corresponding to a result of the detection;
   fixed value generating means for generating, from the first noise signal, a fixed value which is zero, or a value smaller than the value of a component remaining in the first noise signal when reception signal is sufficiently strong, or a value smaller than the first noise signal existing just before a switchover operation;
   noise switchover means for switching the first noise signal over to a fixed value in accordance with the noise switchover control signal to produce and thus output a switched noise signal;
   first noise smoothing means for smoothing the switched noise signal to generate a first noise-smoothed signal;
   hold control signal generating means which takes the first noise-smoothed signal as a threshold value and compares the first noise signal with the threshold value to detect an occurring position and an occurring period of the first noise signal and to generate a hold control signal having a hold period corresponding to a result of the detection; and
   hold means for holding the first input signal in accordance with the hold control signal to generate and thus output the first input signal not containing any noise.

4. The noise removal device according to claim 3, wherein the first noise smoothing means includes a high-speed charge and low-speed discharge circuit for carrying out a high-speed charge and a low-speed discharge in response to an amplitude change of the switched noise signal, thereby generating the first noise-smoothed signal.

* * * * *